United States Patent [19]

Chiu et al.

[11] Patent Number: 5,019,707
[45] Date of Patent: May 28, 1991

[54] HIGH SPEED WAVEFORM SAMPLING WITH A TUNNELING MICROSCOPE

[75] Inventors: George L. Chiu, Cross River; Jean-Marc Halbout, Larchmont, both of N.Y.

[73] Assignee: International Business Machines Corporation, Armonk, N.Y.

[21] Appl. No.: 327,863

[22] Filed: Mar. 23, 1989

[51] Int. Cl.$^5$ .............................................. G01N 23/00
[52] U.S. Cl. ............................................................ 250/306
[58] Field of Search ...................... 250/306, 307, 423 P

[56] References Cited

U.S. PATENT DOCUMENTS

| | | | |
|---|---|---|---|
| 4,343,993 | 8/1982 | Binnig | 250/306 |
| 4,665,313 | 5/1987 | Wells | 250/306 |
| 4,698,502 | 10/1987 | Bednorz | 250/306 |
| 4,724,318 | 2/1988 | Binnig | 250/306 |
| 4,851,671 | 7/1989 | Pohl | 250/306 |

OTHER PUBLICATIONS

"Simplified Scanning Tunneling Microscope for Surface Topography Measurements", *IBM TDB*, vol. 28, No. 10, pp. 4356-4357 (Mar. 1986).
Binning, *IBM Journal of Research and Development*, vol. 30, p. 355 (1986).
Auston, *Applied Physics Letters*, vol. 26, No. 3, p. 101 (1975).
May et al., *Applied Physics Letters*, vol. 51, No. 2, p. 145 (1987).
Menzel et al, *Scanning*, vol. 5, p. 103 (1983).
Hosaka et al., "Observation of pn Junctions on Implanced Silicon Using a Scanning Tunneling Microscope", *Applied Physics Letters*, vol. 53, No. 6, pp. 487-489 (Aug. 1988).
Muralt et al., "Scanning Tunneling Microscopy and Potentiometry on a Semiconductor Heterojunction", *Applied Physics Letters*, vol. 50, No. 19, pp. 1352-1354 (May 1987).

Primary Examiner—Bruce C. Anderson
Attorney, Agent, or Firm—Pollock, Vande Sande & Priddy

[57] ABSTRACT

Stroboscopic voltage measurements are effected within a short time window with very high spatial resolution using a tunneling microscope. Sampling the tunneling current is implemented by modulating the distance between the tunneling tip and a conductor which carries the waveform to be sampled. In one embodiment, the tunneling tip is mounted on a crystal oscillator to modulate the separation between the tunneling tip and the conductor. As an alternative, an acoustic modulator is used to produce mechanical motion in the surface of the sample in order to modulate the distance between the sample and the tunneling tip.

11 Claims, 3 Drawing Sheets

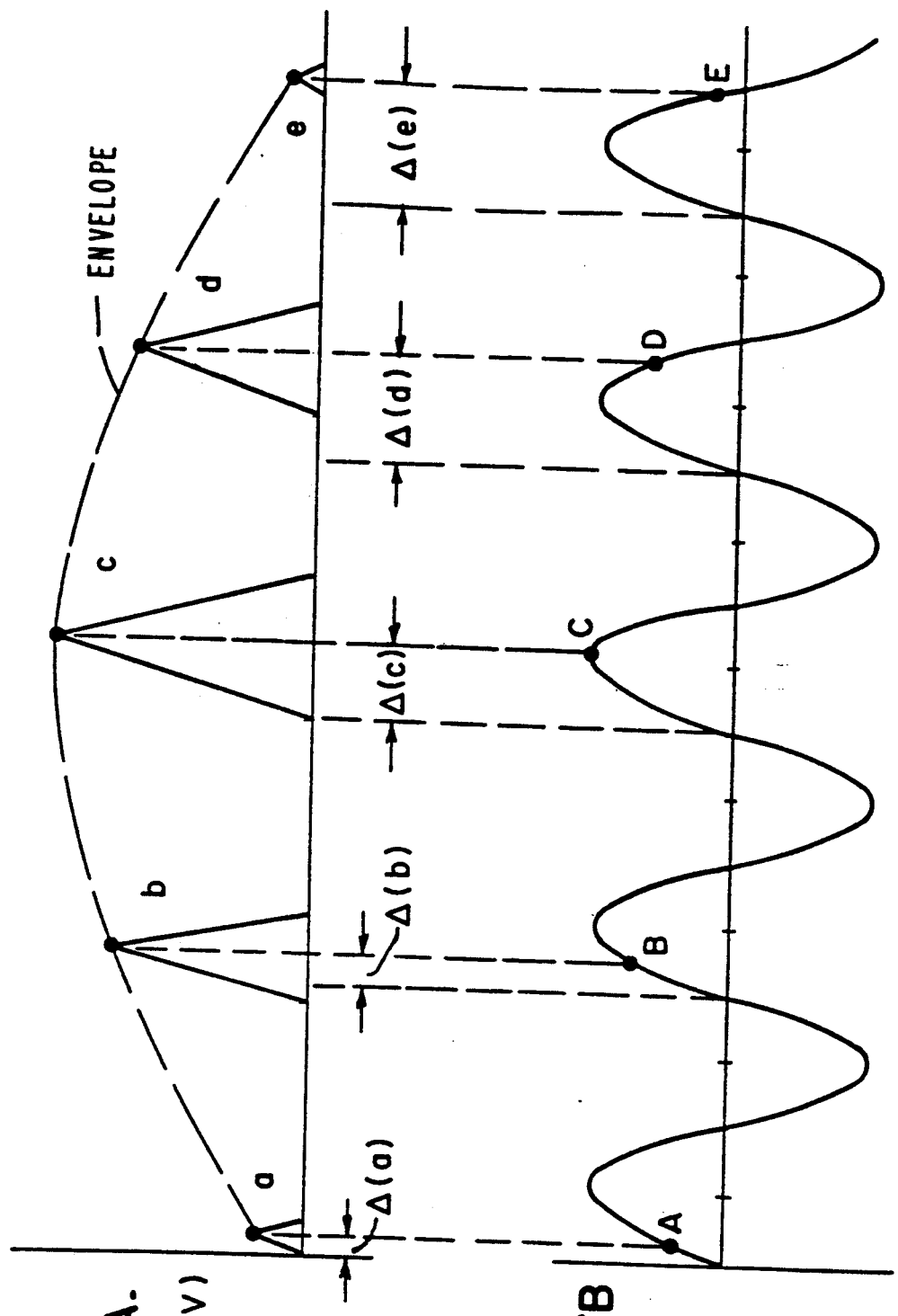

HIGH SPEED WAVEFORM SAMPLING WITH A TUNNELING MICROSCOPE

DESCRIPTION

1. Technical Field

The invention relates to stroboscopic voltage measurements within a short time window with very high spatial resolution using a tunneling microscope. More particularly, sampling the tunneling current is implemented by modulating the distance between the tunneling tip and a conductor which carries the waveform to be sampled.

2. Background Art

Tunneling microscopes and scanning tunneling microscopes are described in U.S. Pat. Nos. 4,665,313; 4,698,502; 4,274,318 and 4,343,993. This subject is also found in "Simplified Scanning Tunneling Microscope for Surface Topography Measurements", *IBM Technical Disclosure Bulletin*, Vol. 28, No. 10, pp. 4356–4357 (March 1986); Binnig, Vol. 30, *IBM Journal of Research and Development*, page 355 (1986); Auston, *Applied Physics Letters*, Vol. 26, No. 3, page 101 (1975); May et al, *Applied Physics Letters*, Vol. 51, No. 2, page 145 (1987) and Menzel et al, *Scanning*, Vol. 5, page 103 (1983). Hosaka et al, in "Observation of pn Junctions on Implanted Silicon Using a Scanning Tunneling Microscope", *Applied Physics Letters*, Vol. 53, No. 6, pp. 487–489 (August 1988) and Muralt et al, in "Scanning Tunneling Microscopy and Potentiometry on a Semiconductor Heterojunction", *Applied Physics Letters*, Vol. 50, No. 19, pp. 1352-1354 (May 1987) also report on STM uses.

Basically, in a tunneling microscope a conductive tip is brought very close to a surface of a sample or a device to be measured. The current carried by the tip can be used to map features of the surface, so long as the current can be accurately measured. However STM-like structures can also be used for potentiometry as reported by Muralt, supra.

One difficulty with measuring fast changing waveforms is that the circuit, including the conductive tip or probe and the surface of the conductor which carries the voltage to be measured, has the characteristics of an RC circuit and integrates the fast waveform. In the absence of other efforts, each current measurement would take on the order of milliseconds for the current to reach a stable value.

Accordingly, it is an object of the invention to enable accurate voltage measurements via stroboscopic tunneling potentiometry. It is another object of the invention to overcome the exponential nature of the tunneling current (as a function of time) in order to allow accurate measurements to be made on fast changing waveforms.

SUMMARY OF THE INVENTION

The invention achieves these and other objects in a scanning tunneling microscope (STM) which includes a test probe, having a test probe tip, and a sample (or device under test) arranged for measurement. The test probe is supported so that the test probe tip exhibits motion toward and away from the sample (and more particularly a conductive stripe laid on the sample surface). In one embodiment, the test probe is driven by a mechanical oscillator to produce the desired motion. The mechanical oscillator operates at a very high frequency (for example in the Ghz range). The tunneling current flowing between the conductive stripe and the top (which is a strong function of the instantaneous potential on the sample) is then determined by the convolution of the motion with the exponential dependence of current with respect to distance (between tip and conductor). Sampling is synchronized with the motion of the test probe tip. This synchronization is effected by using the oscillator output; harmonics or subharmonics of the oscillator output can be used. To produce a time delay between the waveform to be sampled and the actual sampling instant, a standard phase shifter can be used or alternatively the triggering frequency can be offset by a small amount from the chosen subharmonic of the oscillator.

Accordingly, the invention provides a tunneling microscope measurement circuit wherein a distance between a test probe tip and a sample modulates tunneling current, the improvement characterized by a crystal oscillator for modulating the distance between the test probe tip and the sample.

In accordance with another aspect, the invention provides a tunneling microscope including:

a sample and a sampling conductor supported thereon, a mechanical oscillator driven by an oscillator drive signal, a test probe with a test probe tip supported for movement toward and away from said sample conductor in response to motion produced by said mechanical oscillator, and means for detecting tunneling current carried by said test probe tip.

In another embodiment, the mechanical oscillator is replaced by a surface wave generator for generating a surface wave in either tip or sample which has the effect of modulating the distance between tip and sample for the same purpose.

BRIEF DESCRIPTION OF THE DRAWINGS

The invention will be further described in the following portions of this specification when taken in conjunction with the attached drawings in which.

DETAILED DESCRIPTION OF PREFERRED EMBODIMENTS

Figure 1:
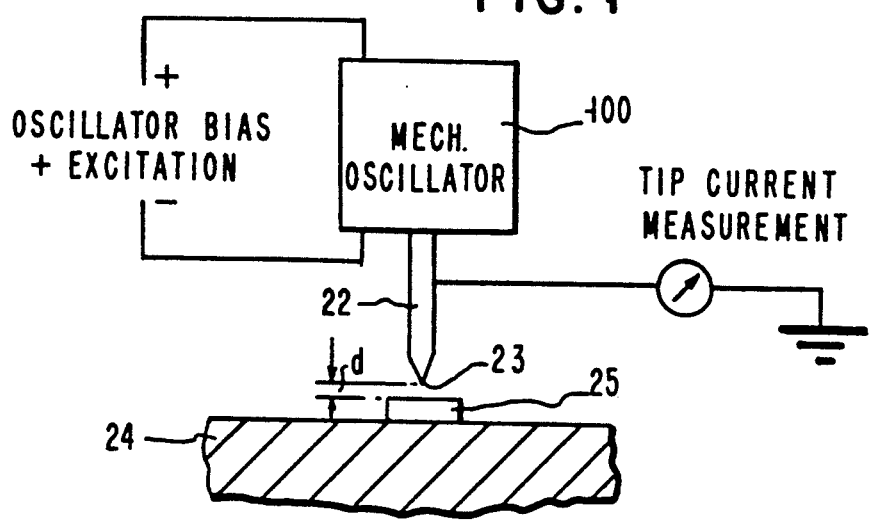
FIG. 1 is a schematic of the mechanical oscillator supporting the test probe in relation to the sample and the sampling conductor carried thereon illustrating the distance d between the test probe tip and the sampling conductor.

FIG. 1 shows the general arrangement of the scanning tunneling microscope in accordance with the present invention. More particularly, a mechanical oscillator 100 driven by an appropriate bias and excitation signal drives a scanning tunneling microscope test probe 22 having a test probe tip 23. The mechanical oscillator and test probe 22 are arranged so that the motion produced by the oscillator varies the distance d between the test probe tip 23 and a sample 24 or more particularly, between the test probe tip 23 and a conductor 25 (a conductive stripe printed on the sample) which is supported on the sample 24.

Figure 2:
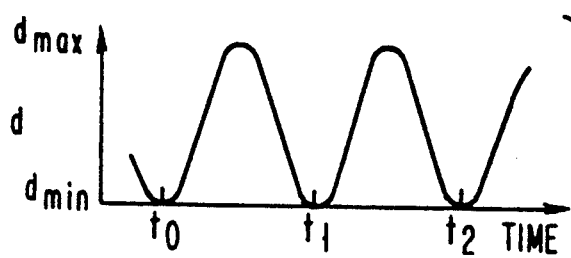
FIG. 2 is a waveform showing variations in the distance d as a function of time.

FIG. 2 shows the variation of distance d between $d_{min}$ and $d_{max}$ as a function of time. More particularly, the sinusoidal motion of the mechanical oscillator is arranged so that the distance d between the test probe tip 23 and the conductor 25 achieves a minimum distance $d_{min}$, at times $t_0$, $t_1$, etc. Although the motion is sinusoidal, it should be apparent that other variations of distance with time could also be employed.

Figure 3:
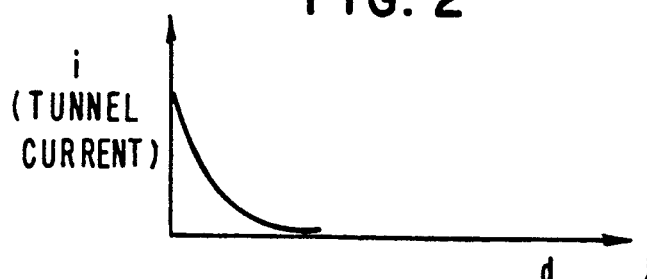
FIG. 3 is a curve showing the variation with tunneling current as a function of distance d.
Figure 4:
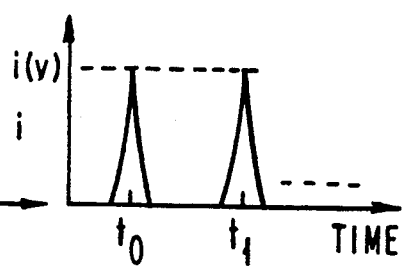
FIG. 4 illustrates the tunneling current as a function of time which is the effect of the variation of the distance d as a function of time.

FIG. 3 shows how the tunneling current i varies as a function of the distance d. More particularly, tunneling current i is an exponential function of the distance d. As is known, it is the voltage difference between sample and tip which generates the tunneling current and therefore the tunneling current is a strong function of the voltage. Thus, tunneling current is used as an indicator of the voltage on the sample. In order to effect an accurate measurement of voltage by measuring current samples, the current samples should be taken under relatively unchanging conditions. The most important condition is the distance d at the time the sample is taken. This constraint is satisfied by ensuring that $d_{min}$, the distance between tip and sample at the measurement time, is relatively constant. Because of the variation in distance d between the test probe tip 23 and the sample conductor 25 (as shown in FIG. 2), the tunneling current, conducted by the tip 23, has the form shown in FIG. 4. More particularly, until the distance d between the test probe tip 23 and conductor 25 is reduced to some threshold, there is substantially no tunneling current. Tunneling current thereafter increases exponentially, reaching a maximum at $t_0$. As the distance d again increases (after $t_0$) the tunneling current falls exponentially and at some point in time essentially ceases. This condition is maintained as the distance d reaches $d_{max}$ and then begins again decreasing. Accordingly, tunneling current again begins to flow just prior to time $t_1$. The tunneling current again reaches a maximum function of the voltage difference between tip and conductor [i(u)] at or about the time $t_1$ and then again begins decreasing. This tunneling current waveform (see FIG. 4) then repeats in relation to the variations with distance d.

Accurate measurement of the voltage on the sample can be effected by measuring the maximum tunneling current achieved at times $t_0$, $t_1$, etc. If the voltage of the sample under measurement is static, then there is no requirement as to the period of the sampling. On the other hand, if the voltage being measured is periodic (or has a periodic component) as is typical, then the sampling instants must be controlled or synchronized with the waveform to accurately record the waveform.

Figure 5:
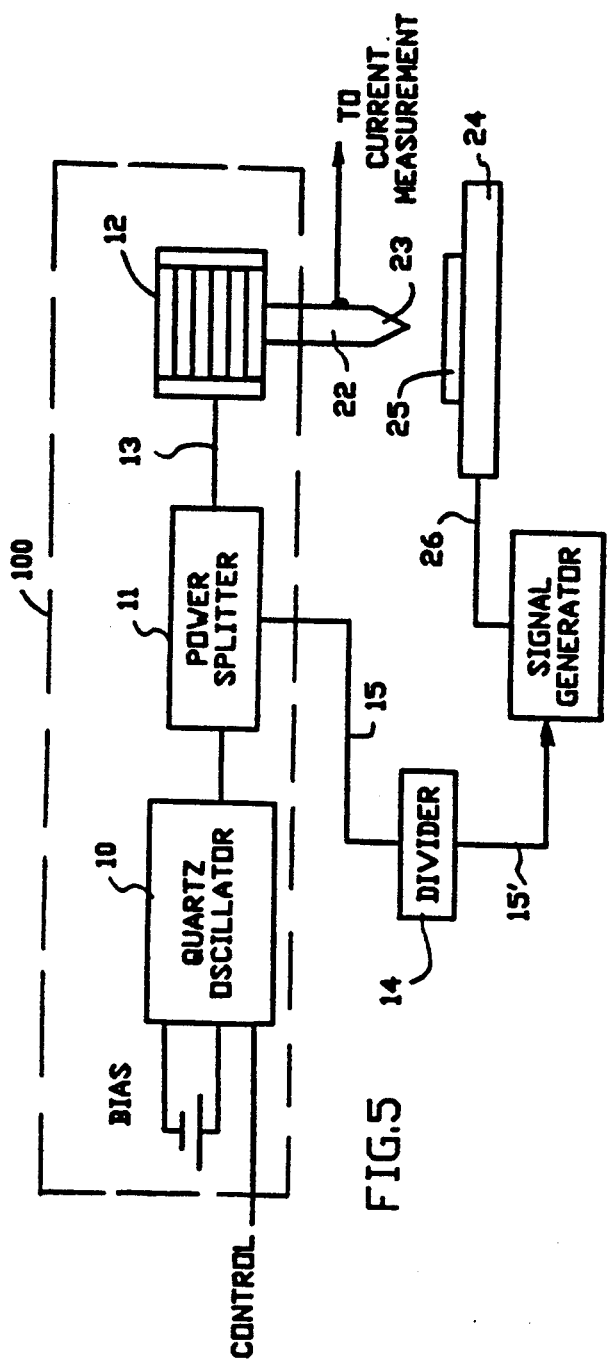
FIG. 5 is a schematic of one arrangement useful for implementing the present invention.

FIG. 5 is a schematic of a preferred embodiment of the present invention. More particularly, as shown in FIG. 5 the mechanical oscillator 100 includes a quartz oscillator 10, the output of which (preferably in the Ghz range) is input to a power splitter 11. One output of the power splitter 11 is used to drive a piezoelectric stack 12. The piezoelectric stack 12 produces mechanical motion in the test probe 22 which is mechanically coupled thereto. The test probe 22 is arranged adjacent a sample 24 on which a conductive stripe 25 is formed. The mechanical motion of the piezoelectric stack 12 produces a corresponding motion in the test probe tip 23 so that the distance d between a test probe tip 23 and the conductor 25 varies as a function of time, as seen in FIG. 2. Typically, the distance $d_{min}$ is in the range of 5-10 Å and $d_{max}$ is about 100 Å.

Another output of the power splitter 11 is taken on the conductor 15 where it may be used to trigger signal generator 27. The voltage waveform to be measured is produced by the signal generator 27 and coupled to the sample via conductor 26.

In a preferred embodiment, the output of the power splitter on conductor 15 is fed into a divider 14 which is arranged to produce, on its output conductor 15', either a harmonic or a subharmonic of the signal produced by the oscillator 10. The signal in the output conductor 15' is then used to trigger the generator 27.

FIGS. 7A and 7B show the effect of the divider 14, or other equivalent delaying arrangements. More particularly, FIG. 7A shows the effect of the distance variation produced by the piezoelectric stack 12, i.e. a series of current pulses a–e, as a function of time. FIG. 7B shows the sample waveform to be measured; it identifies a number of voltage magnitudes A–E, each corresponding to a different one of the current pulses a–e. The peak current pulse a is produced at the time the voltage on the sample 24 has the magnitude A, the current peak b is produced when the voltage on the sample has the magnitude B, etc. Because the period between the current peaks is different from the period of the waveform, the five measurements shown in FIGS. 7A and 7B occur at different points along the waveform. Using this technique, an appropriate number of measurements can be effected to produce an envelope to accurately describe the waveform. FIG. 7A also shows how the relative delays (Δ(a), Δ(b), Δ(c)) grow to obtain the different samples to provide a description of the waveform.

Figure 6:
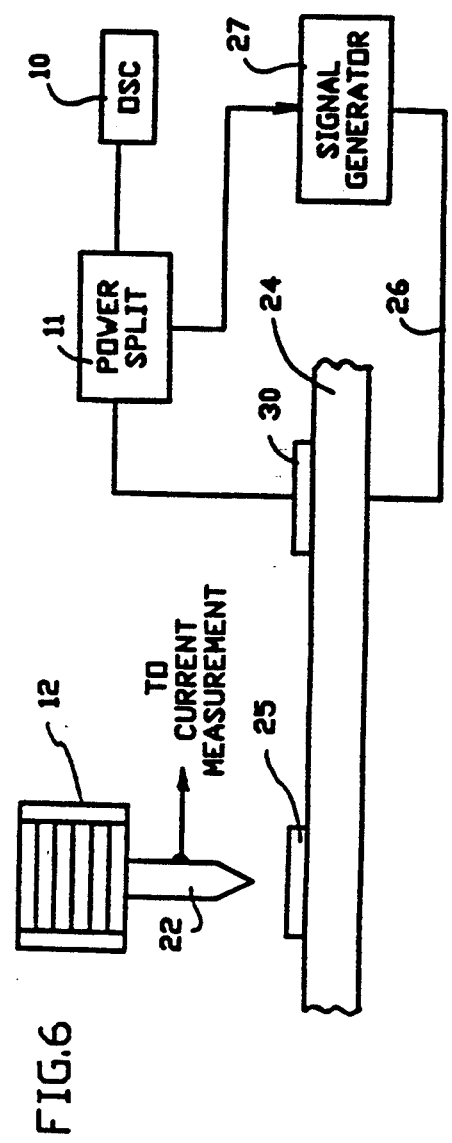
FIG. 6 is a schematic of another embodiment of the invention.

FIG. 6 shows a different embodiment of the invention, one which does not require a mechanical oscillator coupled to the measurement tip. More particularly, FIG. 6 shows the tip 22 in relation to the conductive stripe 25 supported on the sample 24, just as in the case of FIG. 5. However, rather than using a mechanical oscillator directly coupled to the tip 22, FIG. 6 shows that the output of the power splitter is coupled to an acoustic modulator 30 supported on the sample 24. The acoustic modulator 30 produces mechanical motion in the surface of the sample in the form of a wave. When the wave reaches the portion of the sample opposite the measurement tip, the wave produces a variation in the distance d between the measurement tip 22 and the conductive stripe 25. By synchronizing the acoustic modulator 30, a similar distance variation between the tip 25 and the sample 24 can be produced, as was the case with FIG. 5. It should also be apparent that while FIG. 6 shows the acoustic modulator mounted on a sample 24, it is well within ordinary skill to mount the acoustic modulator on the tip 22 for the same purpose. Mounting the acoustic modulator on the tip has the advantage of a non-contact technique relative to the sample.

It should be apparent that the instrument can be calibrated, prior to the actual measurement, by carefully measuring the distance d between the probe tip 23 and a suitable sample. With the oscillator deenergized, the current is allowed to stabilize and is measured by conventional means. Then the oscillator is energized and the measurement made as described with reference to FIGS. 1–5. These two measurements provide a correlation between the gated measurement according to the invention and the stable measurement. By repeating this process at several different, but typical distances, a calibration curve is generated from which a stable current value can be obtained for a given gated measurement.

We claim:

1. A tunneling microscope for effecting measurements on a sample with a sample conductor supported thereon, said microscope comprising:
    a test probe with a test probe tip supported adjacent said sample conductor,
    means for measuring samples of current in said test probe tip, and
    an acoustic modulator for varying the distance between said test probe tip and said sample conductor.

2. The tunneling microscope as recited in claim 1 wherein said acoustic modulator is supported on said sample.

3. A tunneling microscope measurement circuit wherein a distance between a test probe tip and a sample modulates tunneling current, said measuring circuit comprising:
    a piezoelectric stack mechanically coupled to the test probe tip, and
    a crystal oscillator coupled to said piezoelectric stack for modulating the distance between the test probe tip and the sample.

4. A tunneling microscope measurement circuit wherein a distance between a test probe tip and a sample modulates tunneling current, said measurement circuit comprising an acoustic modulator for modulating the distance between the test probe tip and the sample, and
    a crystal oscillator coupled to said acoustic modulator.

5. A tunneling microscope measurement circuit for fast changing waveforms wherein a distance between a test probe tip and a sample modulates tunneling current comprising:
    a crystal oscillator for modulating the distance between the test probe tip and the sample, and
    means for measuring the tunneling current at a time when there is a given distance between the test probe tip and the sample.

6. A tunneling microscope for effecting measurements on a sample and a conductor supported thereon, said microscope comprising:
    a mechanical oscillator driven by an oscillator drive signal,
    a test probe with a test probe tip supported for movement toward and away from said sample conductor in response to motion produced by said mechanical oscillator,
    means for measuring samples of current in said test probe tip,
    said mechanical oscillator including a drive signal source, a power divider responsive to said drive signal source for driving a piezoelectric stack, and
    a frequency divider responsive to said power divider for producing a trigger signal.

7. A tunneling microscope as recited in claim 6 wherein said test probe tip and said piezoelectric stack are arranged to bring said probe tip to within about 5 Å of said sample conductor.

8. A tunneling microscope as recited in claim 7 wherein said test probe tip and said piezoelectric stack are arranged to drive said probe tip about 100 Å from said sample conductor.

9. A tunneling microscope as recited in claim 6 wherein said test probe tip and said piezoelectric stack are arranged to drive said probe tip within a range of about 5 Å to about 100 Å from said sample conductor.

10. A tunneling microscope for effecting measurements on a sample and a conductor supported thereon, said microscope comprising:
    (a) gating means for gating tunneling current on and off, said gating means comprising:
        (a1) a mechanical oscillator driven by an oscillator drive signal, and
        (a2) a test probe with a test probe tip supported for movement toward and away from said sample conductor in response to motion produced by said mechanical oscillator, and
    (b) means for measuring samples of current in said test probe tip.

11. A tunneling microscope as recited in claim 10 wherein:
    said mechanical oscillator is driven by a crystal oscillator.

* * * * *

UNITED STATES PATENT AND TRADEMARK OFFICE
CERTIFICATE OF CORRECTION

PATENT NO. : 5,019,707

DATED : May 28, 1991

INVENTOR(S) : Chiu et al

It is certified that error appears in the above-identified patent and that said Letters Patent is hereby corrected as shown below:

Col. 1, line 17, "4,274,318" should be --4,724,318--.

Signed and Sealed this

Twenty-ninth Day of September, 1992

Attest:

DOUGLAS B. COMER

*Attesting Officer*     *Acting Commissioner of Patents and Trademarks*